United States Patent
Marmash et al.

(10) Patent No.: US 7,382,824 B1
(45) Date of Patent: Jun. 3, 2008

(54) METHOD AND APPARATUS FOR ACCURATE MODELING OF MULTI-DOMAIN CLOCK INTERFACES

(75) Inventors: Naser Marmash, Ashland, MA (US); Adam Peltz, Grafton, MA (US)

(73) Assignee: EMC Corporaration, Hopkinton, MA (US)

( * ) Notice: Subject to any disclaimer, the term of this patent is extended or adjusted under 35 U.S.C. 154(b) by 888 days.

(21) Appl. No.: 10/917,737

(22) Filed: Aug. 13, 2004

(51) Int. Cl.
*H04B 17/00* (2006.01)

(52) U.S. Cl. .................................... 375/224
(58) Field of Classification Search ............. 375/224, 375/371; 713/189; 714/741; 716/6; 703/13, 703/14
See application file for complete search history.

(56) References Cited

U.S. PATENT DOCUMENTS 5,404,402 A * 4/1995 Sprunk ...................... 713/189
6,353,906 B1 * 3/2002 Smith et al. ................. 714/741
2003/0106005 A1 * 6/2003 Jue et al. .................... 714/741
2004/0225977 A1 * 11/2004 Akkerman ..................... 716/6

* cited by examiner

*Primary Examiner*—Don N Vo

(57) ABSTRACT

A simulation model for a system wherein data passes from a source domain to a destination domain, such source and destination domains operating with different, asynchronous clocks provided to the source and destination domains. The model includes a three-stage delay network fed by data from the source domain in response to clock provided to operate the source domain. The network operates in response to clocks provided to operate the destination domain. The model includes a selector having inputs fed by outputs of the three delays and an output fed to the destination domain, such selector randomly providing to the output of such selector outputs of the each of the delays from the three stage delay network. The selector output is randomly chosen only when the data in the source domain changes logical state from a logic low to high or from a logic high to low. Otherwise, if this were performed on every clock of the destination domain, the randomness would not be evenly distributed between all three-delay stages.

4 Claims, 1 Drawing Sheet

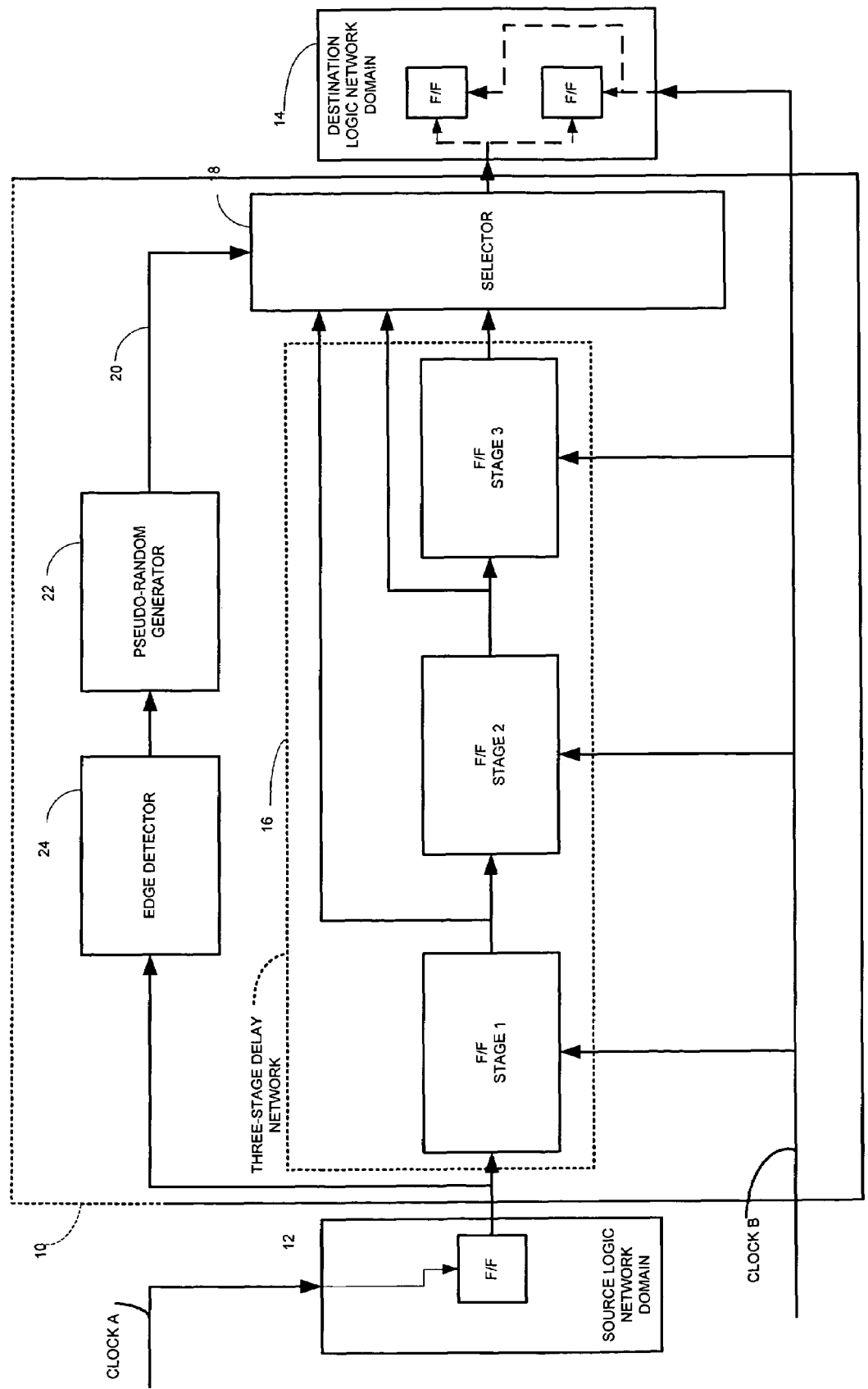

METHOD AND APPARATUS FOR ACCURATE MODELING OF MULTI-DOMAIN CLOCK INTERFACES

TECHNICAL FIELD

This invention relates generally to methods and apparatus for modeling the behavior of signals crossing clock domain boundaries and more particularly to methods and apparatus for providing interfaces between clock domain boundaries in design simulation models.

BACKGROUND AND SUMMARY OF THE INVENTION

As is known in the art, one way to compensate for delays in passing data from a source (i.e., a source domain) to a plurality of different destinations (i.e., a destination domain) is to provide a flip-flop between the source domain and the destination domain. The flip-flop stores the data from the source domain and thus provides a data buffer. This buffered data is then available at a common time for each one of the different destinations, (i.e., the destination domain).

As is also known in the art, there is metastability in a flip-flop. To compensate for such metastability a design frequently includes a second flip-flop preceding the buffering flip-flop. Thus, a two flip-flop synchronizer is provided. This two flip-flop synchronizer approach allows for an entire clock period (except for the setup time of the second flip-flop) for metastable events in the first synchronizing flip-flop to resolve them before being latched in the second flip-flop.

As is also known in the art, it is frequently required that data processed in a first, or source domain, operating with one clock, be passed to a second, or destination; domain operating with a different, clock asynchronous with the first cloak, i.e., the two domains operate asynchronously.

As is also known in the art, prior to finalizing any design, the design is typically simulated. The inventors have recognized that with such an asynchronous system, there is a randomness of the arrival of the valid and stable signal in the destination domain that is not accounted for during the initial design simulation phase. That is, the inventors have recognized that it could take (one or two) clocks under one placement and routing condition or (two or three) clocks under a different placement and routing condition for the valid signal to arrive at the receiving block because of the relative phase between the clock operating the source domain and the clock operating the destination domain. This randomness is due to the possibility of the first stage of the two stage synchronizer of going meta-stable which occurs when a signal misses the required setup time of the synchronizer flip flop and of the fact that synthesis placement and routing of signals crossing clock domains are usually constrained in static timing as a multi-cycle path. Current verification approach of dealing with this issue has been to lock the arrival delay of the synchronized signal to two clocks (i.e., assume that the first stage flip flop never goes meta-stable) and perform verification based on that assumption. This approach could open up the possibility of masking a functional bug in the receive logic if it happens that the arrival time of the synchronized signal matter to that logic. i.e., if the destination domain would behave differently if the cross clock domain signal arrives two clocks delayed verses three clock delayed.

More particularly, traditionally, designers infer for the simulation, two back-to-back flip flops "synchronizers" in the register transfer level (RTL) "verilog" code to insure stable transition of signals crossing clock boundaries. This in turn fixes the delay in between the clock domains into two clocks, thus implicitly assuming that the first synchronization stage never goes meta-stable. Functional simulation of logic in the domains, normally progresses on this assumption. In reality, the first synchronizer stage would and could get meta-stable (this is the purpose of the meta-stable flip flops to begin with) and thus delay the arrival of the valid and stable signal by an extra clock cycle. The inventors have recognized this as a random event that could be affected by the phase alignment of the launch and receive clocks and have accounted for it in accordance with the present invention.

More particularly, the inventors discovered that in order to accurately simulate the behavior of signals crossing clock boundaries, it is essential to model the random behavior of the meta-stability phenomena encountered in such scenarios. Therefore, it is important to have a meta-stable logical block that has the capability of varying the cross clock domain delay by either one clock cycle, by two clock cycles, or randomly selecting between the two.

The random selection of the delay (1 or 2 clock cycles) insures covering the various state cases and transitions of the receive logic, by exposing any functional dependencies on the arrival of cross clock domain signals. This would cover any functional anomalies simulating at the register transfer level (RTL) level.

The inventors have also recognized that a second condition exists because of the fact that ASICs and modem FPGAs are running at faster and faster speeds which should be accounted for in the design simulation. That is, any path that crosses clock boundaries most likely does not consist of single cycle timing in regards to static timing analysis or synthesis, also referred to as multi-cycle path. This could cause the actual time to register through the back-to-back flip-flops to actually be either two clock cycles or three clock cycles. Thus it is important to randomly select the delay (2 or 3 clock cycles) as well.

In accordance with the present invention, a simulation is provided that considers both conditions into consideration; i.e., a 1 or 2 clock cycles delay as well as a 2 or 3 clock cycles delay. Since the synthesis, placement, and routing of the networks crossing clock domains determine which one of the two conditions exist, using a single condition of 1, 2, or 3 clock cycles is not valid since it would over-test the design. A single condition can be made of randomly selecting (1, 2, or 3 clock cycles) and never transitioning from (1 to 3 clock cycles) or from (3 to 1 clock cycles). This will then take into consideration the meta-stability nature of the double flip-flops as well as the single and multi-cycle paths of signals crossing clock domains.

In accordance with the present invention, a simulation model for a system wherein data passes from a source domain to a destination domain, such source and destination domains operating with different, asynchronous clocks provided to the source and destination domains. The model includes a three-stage delay network fed by data from the source domain in response to clock provided to operate the source domain. The network operates in response to clocks provided to operate the destination domain. The model includes a selector having inputs fed by outputs of the three delays and an output fed to the destination domain, such selector randomly providing to the output of such selector outputs of the each of the delays from the three stage delay network.

In one embodiment, the selector output is randomly chosen only when the data in the source domain changes logical state from a logic low to high or from a logic high to low. Otherwise, if this were performed on every clock of the destination domain, the randomness would not be evenly distributed between all three-delay stages.

The details of one or more embodiments of the invention are set forth in the accompanying drawings and the description below. Other features, objects, and advantages of the invention will be apparent from the description and drawings, and from the claims.

DESCRIPTION OF DRAWINGS

The single FIGURE is a diagram of a system having a simulation model according to the invention.

DETAILED DESCRIPTION

Referring now to the single FIGURE, a block diagram of a simulation model 10 is shown for a system wherein data passes from a source logic network domain 12 to a destination logic network domain 14 is shown. The source and destination domains 12, 14 include logic, here represented by flip/flips (F/Fs) as shown, operating with different, asynchronous clocks provided to the source and destination domains. Thus, here the logic in the source domain 12 operates with clock A and the destination domain 14 operates with clock B. Clock A and clock B are asynchronous with each other and may be of different frequencies. The model 10 includes a three-stage delay network 16 fed by data from the source domain 12 in response to clock A provided to operate the source domain 12. The network 16 operates in response to clock B provided to operate the destination domain; 14. Here each one of the three stages, stage 1, stage 2 and stage 3, is here represented as a flip/flop fed by the clock B as shown.

The model 10 includes a selector 18 having the inputs thereof fed by the output of a corresponding one of the three states, stage 1, stage 2 and stage 3, as shown. The output of the three-stage delay network is fed as the input to the destination logic network delay 14, as shown. A control signal is fed to the selector 18 on bus 20. Such control signal on bus 20 is a two-bit word. In response to a logic 00 on bus 20 the selector 18 couples to the output thereof the output of stage 1; in response to a logic 01 on bus 20 the selector 18 couples to the output thereof the output of stage 2; and in response to a logic 10 on bus 20 the selector 18 couples to the output thereof the output of stage 3.

The two-bit signal on bus 20 is randomly selected by a pseudo-random generator 22. Thus, selector 18 randomly provides to the output of such selector 18 outputs of the each of the delays (i.e., stages) from the three-stage delay network 16.

The two-bit control words are produced by the pseudo random generator 22 only when the data in the source domain 12 changes logical state from a logic low to high or from a logic high to low to enable a uniform randomness between all three stage selections. Thus, an edge detector 24 is shown fed by the output of the source domain logic 12 to trigger the generation of each new randomly generated two-bit control word on bus 20.

The way silicon vendors typically model their flip flop behavior at the gate level is by forcing the flip flop output to an "X-state, i.e., unknown state" when its input setup time requirement is not met. The X-state is persistent meaning when a flip flop output goes to an X-state, it would not recover from it. The X-state would eventually propagate to the various elements of the design forcing the gate level simulation to either mis-compare or hang-up.

Therefore, at the gate level simulations with multiple clocks, designers traditionally would either pick the slowest operating clock frequency and force all the clocks to that frequency, or would use the actual operating frequencies but make sure the various clock phases are line up in such away that the meta-stability synchronizer flip flops would never go to an X-state. Once such clocks phase alignment is found, normally it is not changed through out the gate level verification timeframe. Both options mentioned above, do have a weakness in their inability to accurately model the actual behavior of the multi clock domain crossing circuit. In gate level simulation, it is desirable to use the real frequencies of the various clocks used in the system as well as to be able to shmoo the various clock phases to accurately model the randomness of these phases. What was meant by shmooing is: If we take two clocks at different frequencies (clock A and clock B) and we assume as an example that the Clock A phase leads the clock B. Over time clock B will eventually lead clock A since the period of the two clocks are not the same. In simulation, the act of simulating the entire time range between clock A leading clock B and then Clock B leading clock A is what is meant by shmooing.

Achieving both goals would require a mechanism of preventing the first stage of the meta-stability flip flop synchronizer from going to an X-state. This is easily done by copying and renaming the flip flops used in the meta-stable module (after gate level mapping and synthesis to a particular silicon vendor) and then disabling the timing check on the copied flip flop module. This insures that the synchronizer would recover from an input setup time violation and therefore would never get to an X-state. Note that, the timing check is only disabled for one flip flop type which did get renamed so no other logic in the design gets affected.

Doing so has three advantages, first, it allows the gate level design to be verified using the actual clock frequencies. Second, it allows shmooing the various clock phases, allowing for more accurate timing checks. Third, it allows for an easy way of post synthesis identification of the cross clock boundary signals.

To accurately simulate the behavior of signals crossing clock boundaries, it is essential to model the random behavior of the meta-stability phenomena encountered in such scenarios. Therefore, it is important to have a meta-stable logical block that has the capability of varying the cross clock domain delay by either one clock cycle, by two clock cycles, or randomly selecting between the two. The random selection of the delay (1 or 2 clock cycles) would insure covering the various state cases and transitions of the receive logic, by exposing any functional dependencies on the arrival of cross clock domain signals. This would cover any functional anomalies simulating at the register transfer level (RTL).

A second condition exists because of the fact that ASICs and modem FPGAs are running at faster and faster speeds. Any path that crosses clock boundaries most likely does not consist of single cycle timing in regards to static timing analysis or synthesis, also referred to as multi-cycle path. This could cause the actual time to register through the back-to-back flip flops to actually be either two clock cycles or three clock cycles. Thus it is important to randomly select the delay (2 or 3 clock cycles) as well.

In the physical world it is possible that depending on how the transistors were physically placed & routed onto the ASIC silicon die the pulse delay can be either 1 and 2 clock delays, or 2 and 3 clock delays. Taking into consideration that either condition can exist exclusively in the real world, the model 10 switches between the following clock delays:

1 to 2 clocks
2 to 1 clocks
2 to 3 clocks
3 to 2 clocks

Switching from 1 to 3 clocks or 3 to 1 clocks is not allowed since this does not represent the physical world. Thus, choosing the number of clocks to delay is not fully random but rather pseudo-random. Specifically:

Physical Condition 1: Under the physical condition that the etch delay from (the output of the flip flop on clock A) to (the input of the first flip flop in clock B) is very rapid:
  A) If (clock A) has a phase lead to (clock B), (1 clock) delay is possible
  B) If (clock B) has a phase lead to (clock A), (2 clock) delay is possible Physical Condition 2: Under the physical condition that the etch delay from (the output of the flip flop on clock A) to (the input of the first flip flop in clock B) is very slow:
  A) If (clock A) has a phase lead to (clock B), (2 clock) delay is possible
  B) If (clock B) has a phase lead to (clock A), (3 clock) delay is possible It is noted that the overall decision of which delay to use (1,2,3) is not even; but rather, the decision to switch between the two physical conditions is even. This makes the design switch between the 1-2-1-2-1 condition and the 3-2-3-2-3 condition evenly. It should also be noted that a decision to make a "random" choice is done on every input (from source domain) changing and not on every clock edge. Doing it on every clock edge would favor the 1 clock over the 2 over the 3, thus favoring the 1-2-1-2-1 condition by a large percentage.

The exact probability percentage that may, for example, be used from switching from one delay is the following:
  If at 1 clock, 25% stay 1, 75% go to 2, 0% go to 3;
  If at 2 clocks, 25% go to 1, 50% stay 2, 25% go to 3;
  If at 3 clocks, 0% go to 1, 75% go to 2, 25% stay 3;

Ideally if at 2 clocks all three conditions should be 33%, but that would have made the test logic more complicated and the above has been determined to operate satisfactory in the test environment.

The following is an example of the meta-stability flip flop "meta_ff" verilog module. This example is meant to show the basics of the implementation; of course, it could be modified to fit various implementation needs. In this example, a single bit is implemented, but with a minimal modification, multi bit module could be accommodated.

The verilog "ifdef" feature is being used to select between either the simulation mode, or the synthesis mode which is the default setting. This directive would normally be set somewhere in the verification environment, outside this module. In addition, the "ifdef" directives could be used to deterministically select between 1, 2, or 3 clock delays instead of the random setting.

```
//This part is for functional simulations only.
`ifdef SIMULATION
    module meta_ff (clk, reset, in, out);
        input           clk;            //clock
        input           reset;          //reset
        input           in;             //input signal to the synchronizer block
        output          out;            //output signal out of the synchronizer block
        reg             stage1, stage2, stage3;   // First, second and third delays
        reg [1:0]       whichstage;     // Delay Selector
        reg [1:0]       which_sync;     // One clock delay of whichstage
        assign          out =           (which_sync==2'h1)      ? stage1 :
                                        ((which_sync==2'h3)     ? stage3 : stage2);
        always @(in)
            begin
                whichstage[0] = $random;
                whichstage[1] = $random;
                if (      (which_sync==2'h3 && whichstage==2'h1) |
                          (which_sync==2'h1 && whichstage==2'h3) )
                    whichstage = 2'h2;
            end
        always @(posedge clk)
            if (reset)
                begin
                    which_sync <= 2'h0;
                    stage1 <= 1'b0;
                    stage2 <= 1'b0;
                    stage3 <= 1'b0;
                end
            else
                begin
                    which_sync <= whichstage;
                    stage1 <= in;
                    stage2 <= stage1;
                    stage3 <= stage2;
                end
    endmodule
//This part is for synthesis only. It does infer two back-to-back flip flops "synchronizers".
`else
    module meta_ff(clock, reset, in, out);
        input   clock, reset, in;
        output out;
```

```
                        reg         amf_out, amf_syncli;
                        wire        out = amf_out;
        always @ (posedge clk)
            begin
                if (reset)
                    begin
                        amf_syncli              <= 1'b0;
                        amf_out                 <= 1'b0;
                    end
                else
                    begin
                        amf_syncli              <= in;
                        amf_out                 <= amf_syncli;
                    end
            end
    endmodule
`endif
```

Therefore, to accomplish the functional and gate level simulation thoroughness, a verilog module like the one shown above would be created. The designers would have to instantiate this module for any signal that crosses a clock boundary. The module contains two sections, one section to be used during the functional simulation. The simulation section could be passed "ifdef" directives from the simulation environment. (ifdef directives can be switched to run-time switches, if there is a need) The directive would force either two clock cycle synchronization delay, or a random selection between the three settings.

In the gate level simulation, the final netlist would contain the created verilog module, and inside the module would be—a silicon vendor specific-two flip flops instantiated. To disable the timing checks of these two flip flops, a renamed copy of the verilog gate level representation is made, and the timing check is turned off only in the renamed module. Note that all flip flops start with either amf_sync1i or amf_out if register names are not changed dramatically during synthesis, placement, or routing.

Traditionally, designers would instantiate or infer two back-to-back flip flops "synchronizers" in the RTL "verilog" code to insure stable transition of signals crossing clock boundaries. This in turn would lock the delay in between the clock domains into two clocks, thus implicitly assuming that the first synchronization stage never goes meta-stable. Functional simulation of the logic, normally progresses on this assumption. Where in reality, the first synchronizer stage would and could get meta-stable (this is the purpose of the meta-stable flip flops to begin with) and thus delaying the arrival of the valid and stable signal by an extra clock cycle. This is of course a random event that could be affected by the phase alignment of the launch and receive clocks.

A number of embodiments of the invention have been described. Nevertheless, it will be understood that various modifications may be made without departing from the spirit and scope of the invention. Accordingly, other embodiments are within the scope of the following claims.

What is claimed is:

1. A simulation model for a system wherein data passes from a source domain to a destination domain, such source and destination domains operating with different, asynchronous clocks provided to the source and destination domains, such model comprising:
    a three-stage delay network fed by data from the source domain in response to clock provided to operate the source domain, such network operating in response to clocks provided to operate the destination domain; and
    a selector having inputs fed by outputs of the three delays and an output fed to the destination domain, such selector randomly providing to the output of such selector outputs of the each of the delays from the three stage delay network.

2. The model recited in claim 1 wherein the selector randomly provides to the output thereof outputs of the each of the delays from the three-stage delay network when the data in the source domain changes logical state from a logic low to high or from a logic high to low.

3. A method for simulating a system wherein data passes from a source domain to a destination domain, such source and destination domains operating with different, asynchronous clocks provided to the source and destination domains, such method comprising:
    providing a three-stage delay to data from the source domain in response to clock provided to operate the source domain, such delay operating in response to clocks provided to operate the destination domain; and
    selecting outputs of the three stage delay for the destination domain, such selection being random.

4. The method recited in claim 3 wherein the selection is randomly provided to the output thereof outputs of the each of the delays when the data in the source domain changes logical state from a logic low to high or from a logic high to low.

* * * * *